United States Patent [19]
Yen

[11] Patent Number: 5,401,670
[45] Date of Patent: Mar. 28, 1995

[54] TECHNIQUE TO MANUFACTURE A SOI WAFER AND ITS APPLICATIONS IN INTEGRATED CIRCUITS MANUFACTURING

[76] Inventor: Yung-Chau Yen, 5770 Harder St., San Jose, Calif. 95129

[21] Appl. No.: 120,797

[22] Filed: Sep. 15, 1993

[51] Int. Cl.⁶ .......................................... H01L 21/265
[52] U.S. Cl. ........................................ 437/21; 437/84; 437/83; 437/225; 437/915
[58] Field of Search ................ 437/21, 83, 84, 225, 437/915; 148/DIG. 12, DIG. 150, DIG. 164

[56] References Cited

U.S. PATENT DOCUMENTS

| | | |
|---|---|---|
| 4,109,846 | 8/1978 | Pennings et al. ................ 228/6 |
| 4,824,489 | 4/1989 | Cogan et al. ..................... 437/2 |
| 5,129,827 | 7/1992 | Hoshi et al. .................... 437/62 |
| 5,152,857 | 10/1992 | Ito et al. ........................ 437/974 |
| 5,160,560 | 11/1992 | Welkowsky et al. ...... 148/DIG. 12 |

*Primary Examiner*—Ramamohan Rao Paladugu

[57] ABSTRACT

A SOI wafer is produced by employing a bonding tool set which can be repeatedly used to reduce manufacturing cost. The use of a bonding tool set enables its application in the fabrication of IC patterns on both sides of a thin semiconductor film. A new IC fabrication method called parallel process technique is developed to manufacture integrated circuits by utilizing a bonding tool set. This parallel process technique simplifies the complex IC chip fabrication in addition to the yield improvement and the reduction of cycle time.

29 Claims, 10 Drawing Sheets

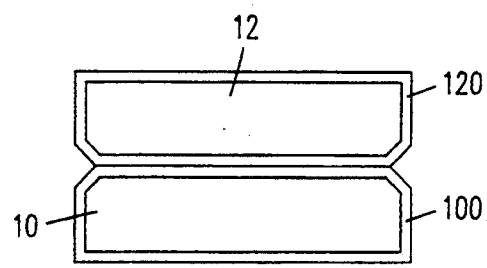
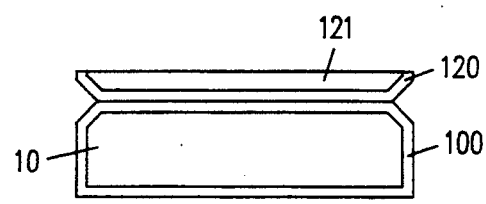
FIG. 1a  FIG. 1b
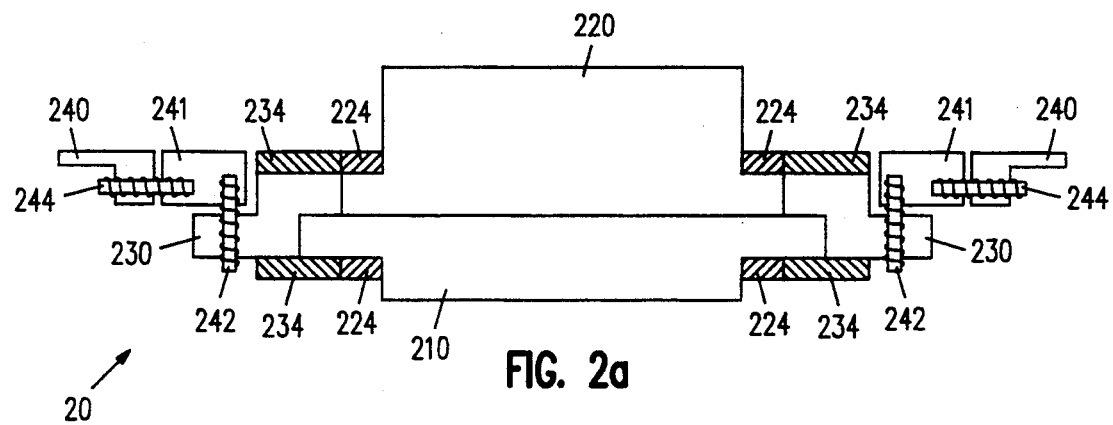
FIG. 2a
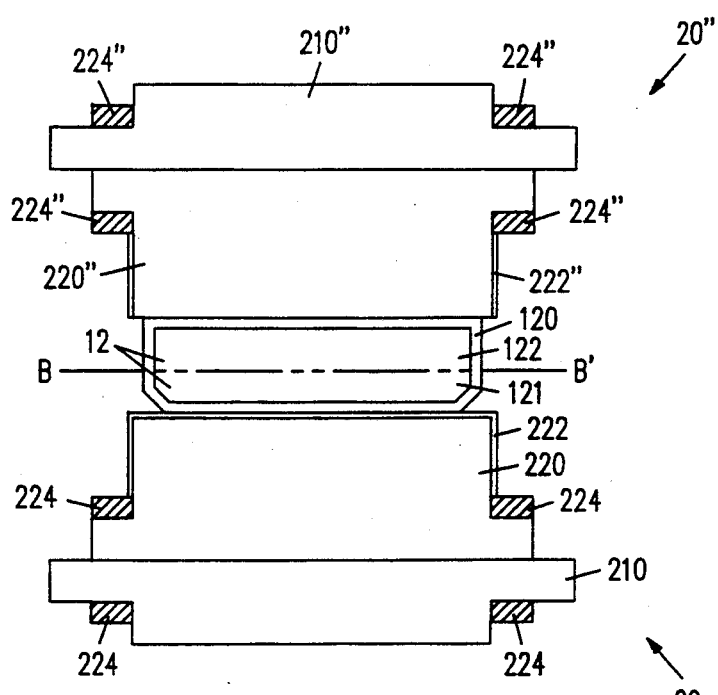
FIG. 2b

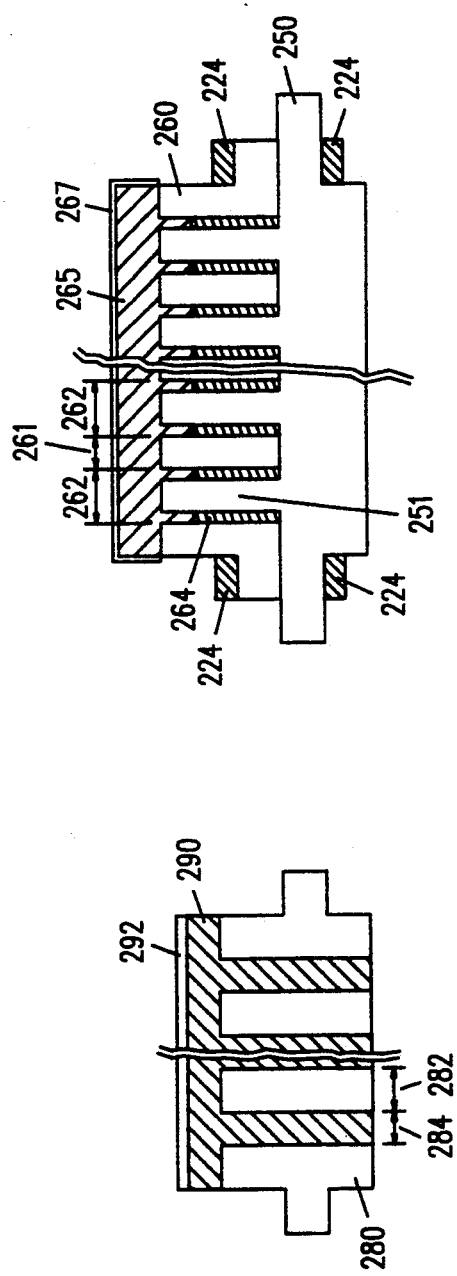
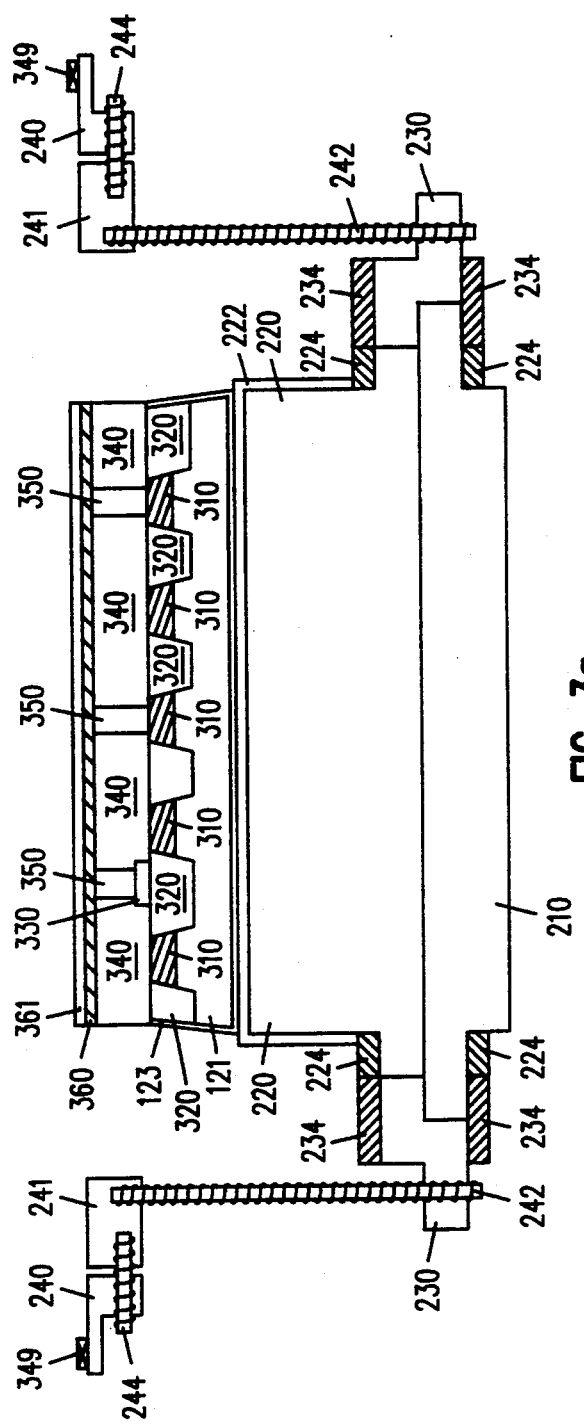

TECHNIQUE TO MANUFACTURE A SOI WAFER AND ITS APPLICATIONS IN INTEGRATED CIRCUITS MANUFACTURING

FIELD OF THE INVENTION

This invention relates to the field of the manufacturing technique in producing a single crystal semiconductor film on insulator (SOI) and in making integrated circuits on SOI.

PRIOR METHOD

SOI technique has been employed to make integrated circuits (hereafter called IC) for the high frequency operation and better performance when high mobility material such as compound semiconductor Gallium Arsenide (GaAs) was not used. Several methods have been developed to obtain SOI wafer. The two most commercially used methods were the bonded wafer technique and the high energy oxygen ($O_2$) implant technique. In the bonded wafer technique as shown in FIG. 1a, two wafers, holding wafer 10 with silicon dioxide (hereafter called $SiO_2$) layer 100 and bonded wafer 12 with $SiO_2$ layer 120 were bonded together, followed by lapping the bonded wafer 12 to the desired thickness as shown in FIG. 1b. Then, polishing operation was performed to achieve the desired surface state of the final thin film 121 for the IC fabrication. This method seems simple, but most bonded wafer 12 was wasted by the lapping operation and the wafer edge can be easily chipped off during wafer handling. In the high energy $O_2$ implant method (not shown), $O_2$ ion beam was implanted into the bonded wafer 12 to the desired depth, followed by the high temperature anneal to obtain $SiO_2$ layer under silicon film. A very expensive implant machine is needed for this method. Also, both methods suffered a difficulty in fabricating more than one silicon film when needed. This invention will teach a technique to solve these problems.

SUMMARY OF THE INVENTION

It is the object of this invention to provide a technique to produce a SOI wafer which is cost effectively manufactured for the IC fabrication.

It is the second object of this invention to provide a technique of the alignment operation to produce multi-level SOI-structured wafer.

It is the third object of this invention to provide a technique to manufacture IC patterns on both sides of SOI structure.

It is the fourth object of this invention to provide a technique to manufacture IC with a parallel process method which simultaneously makes each patterned layer (or a group of patterned layers) on a separate SOI structure, followed by bonding the SOI structures to complete IC fabrication.

DESCRIPTION OF FIGURES

All drawings are not to scale. Their only purpose is to explain the principles of this invention.

FIG. 1 shows the cross sectional view of the prior art.

DETAILED DESCRIPTION OF INVENTION

Figure 2C:
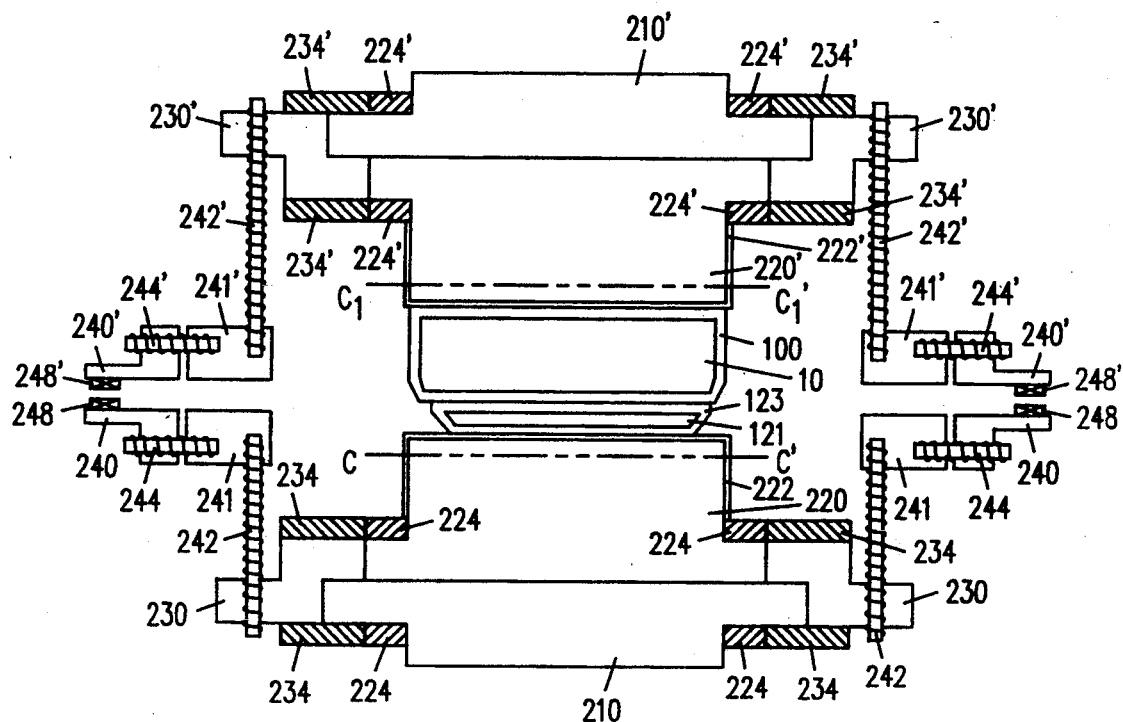
FIG. 2 demonstrates the steps to make a SOI wafer according to this invention.

Referring to FIG. 2, the cost-effective manufacturing of a single crystal silicon film is obtained by employing the use of the bonding tool set 20 which is shown in FIG. 2a in the cross sectional view. Bonding tool set 20 consists of support plate 210, bonding assistant plate 220, and alignment set which consists of alignment ring support 230, alignment ring movement support 241 and alignment annular ring 240. Alignment annular ring 240 can be in a continuous circular ring or in a form of several segmental rings along the perimeter of bonding assistant plate 220, and can also be rotated horizontally (not shown) in addition to the movement vertically by vertical screw 242 (which is attached to alignment ring support 230) and horizontally by horizontal screw 244, both supported by alignment ring movement support 241. Alignment ring support 230 is fastened to support plate 210 by clamp-2 234. Bonding-assistant plate 220 is fastened to support plate 210 by clamp-1 224. Materials used to construct bonding tool set 20 are suitable for the IC manufacturing environments. Examples are silicon, quartz, stainless steel and teflon which are the common materials used in IC clean room. In order to explain the principle of this invention, one example of the material selection is given, although many different kinds of selections are applicable. Poly crystal silicon is used for bonding-assistant plate 220, stainless steel is used for support plate 210, alignment ring support 230, alignment ring movement support 241, both vertical and horizontal screws 242, 244, clamp-1 224, and clamp-2 234. Quartz is used for alignment annular ring 240. Both surfaces of support plate 210, bonding-assistant plate 220 and alignment annular ring 240 are flat parallel, mirror-like polished. After another bonding tool set 20'' is assembled without another alignment set, silicon dioxide layer 222'' is formed. The typical thickness is about 1 micro-meter (hereafter denoted as um). The bonded wafer 12 of FIG. 1a is bonded to bonding-assistant plate 220''. Now bonding tool set 20 without alignment set which has $SiO_2$ layer 222 after assembly is bonded to bonded wafer 12 which is bonded to another bonding tool set 20'' as shown in FIG. 2b. Bonded wafer 12 is sandwiched by two bonding-tool sets without alignment sets and sliced along line BB' at rounded edge side. Therefore, thin silicon film 121 is bounded to bonding-assistant plate 220, while the remaining bonded wafer 122 is still bonded to another bonding assistant plate 220'' and can be further processed to obtain another thin silicon film. Now silicon film 121 is lapped and polished to the desired thickness. Silicon dioxide 123 layer is formed on silicon film 121 followed by the assembly of the alignment set as shown in FIG. 2c. Alignment pattern 248 of alignment annular ring 240 is positioned at the desired location. At the same time, holding wafer 10 of FIG. 1a is bonded to other bonding tool set 20' with the same method as described in FIG. 2b. The other alignment pattern 248' of other alignment annular ring 240' of other bonding tool set 20' is also positioned at the desired location. Now holding wafer 10 is bonded to silicon film 121 with the help of the alignment pattern 248 and other alignment pattern 248' as shown in FIG. 2c. After the bonding operation, both alignment sets are dismantled from both bonding tool sets 20 and 20'. Then slicing operation is carried out along line CC' and line $C_1C_1'$, followed by poly etch to obtain the desired SOI wafer which is silicon film 121 on insulators 123 and 100 on the substrate which is holding wafer 10. The SOI wafer so obtained has rounded edge, no additional process step is needed and no edge chip off will occur during wafer handling. Both bonding-assistant plates 220 and 220' can be lapped and polished for the next operation until its final thickness is only slightly above clamps 224 and clamps 234 for the last operation. The new bonding-assistant plate is clamped to support plate 210 to repeat the operation. Or, if both bonding-assistant plates 220 and 220' are just thick enough for one bonding operation, then after the bonding operation, bonding-assistant plates 220 and 220' are dismantled from bonding tool sets 20 and 20' respectively. Poly etch operation is performed to strip off both bonding-assistant plates 220 and 220' to obtain silicon film 121 on insulator 123 and 100 on the substrate which is holding wafer 10.

Figure 2D:
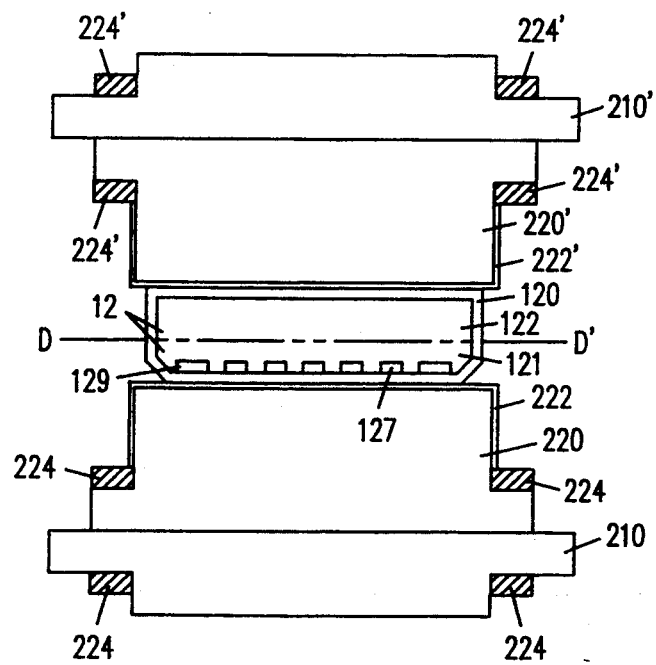
Figure 3C:
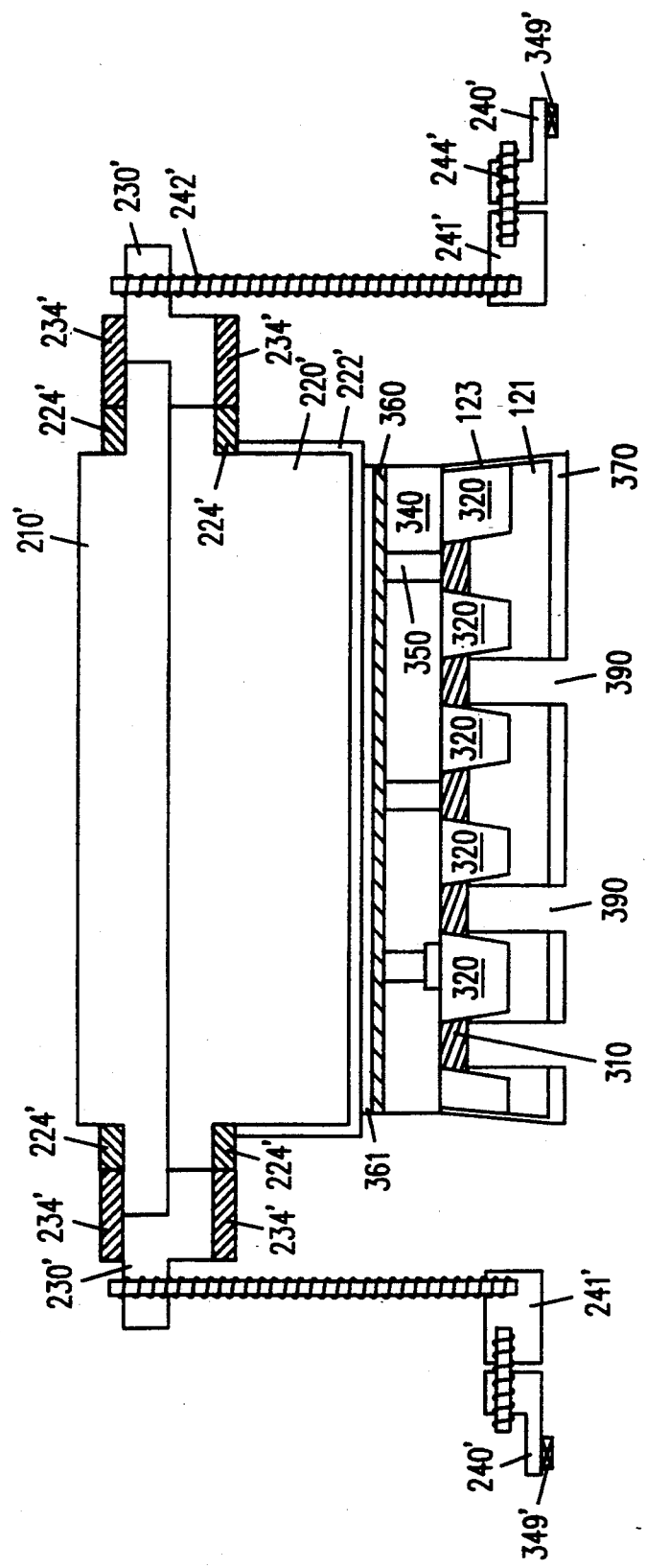
FIG. 3 demonstrates the steps to make metal-line patterns on both sides of the silicon film to alleviate the narrow metal-line definition difficulty as an example of the application of this invention.
Figure 3D:
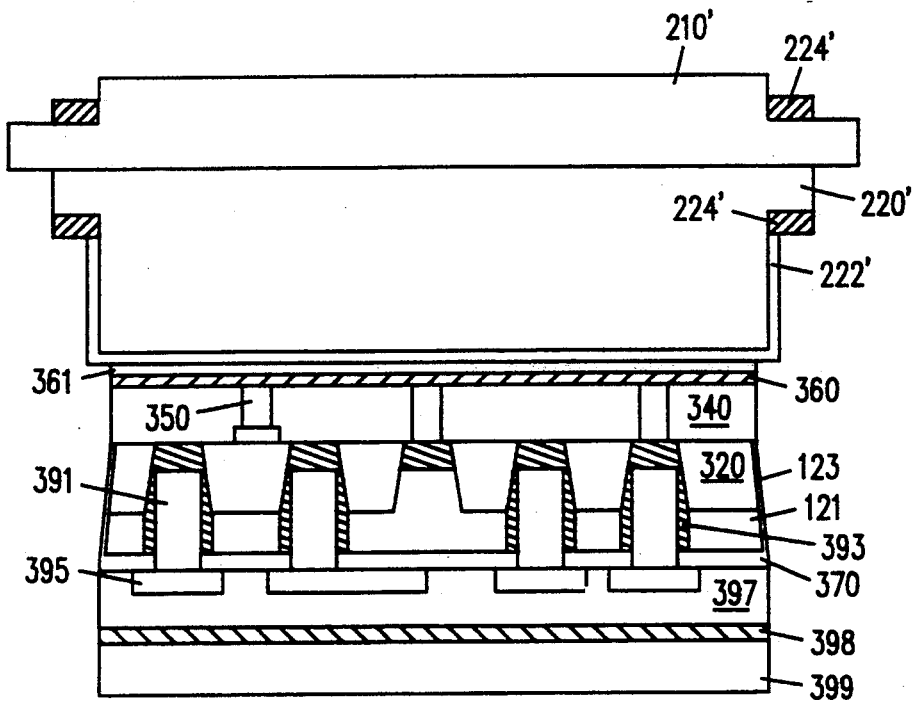
Figure 3E:
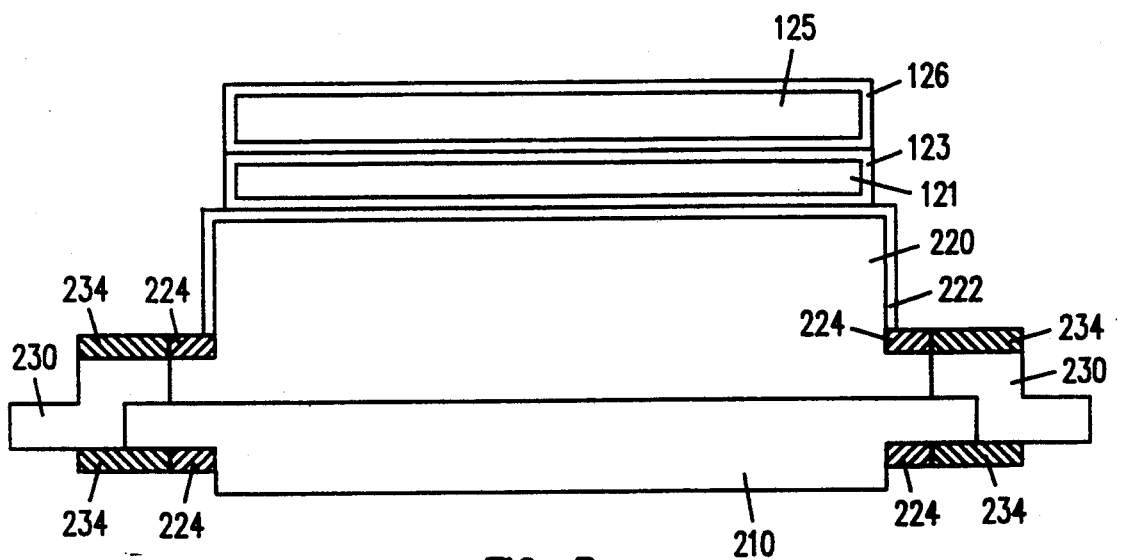
Figure 3B:
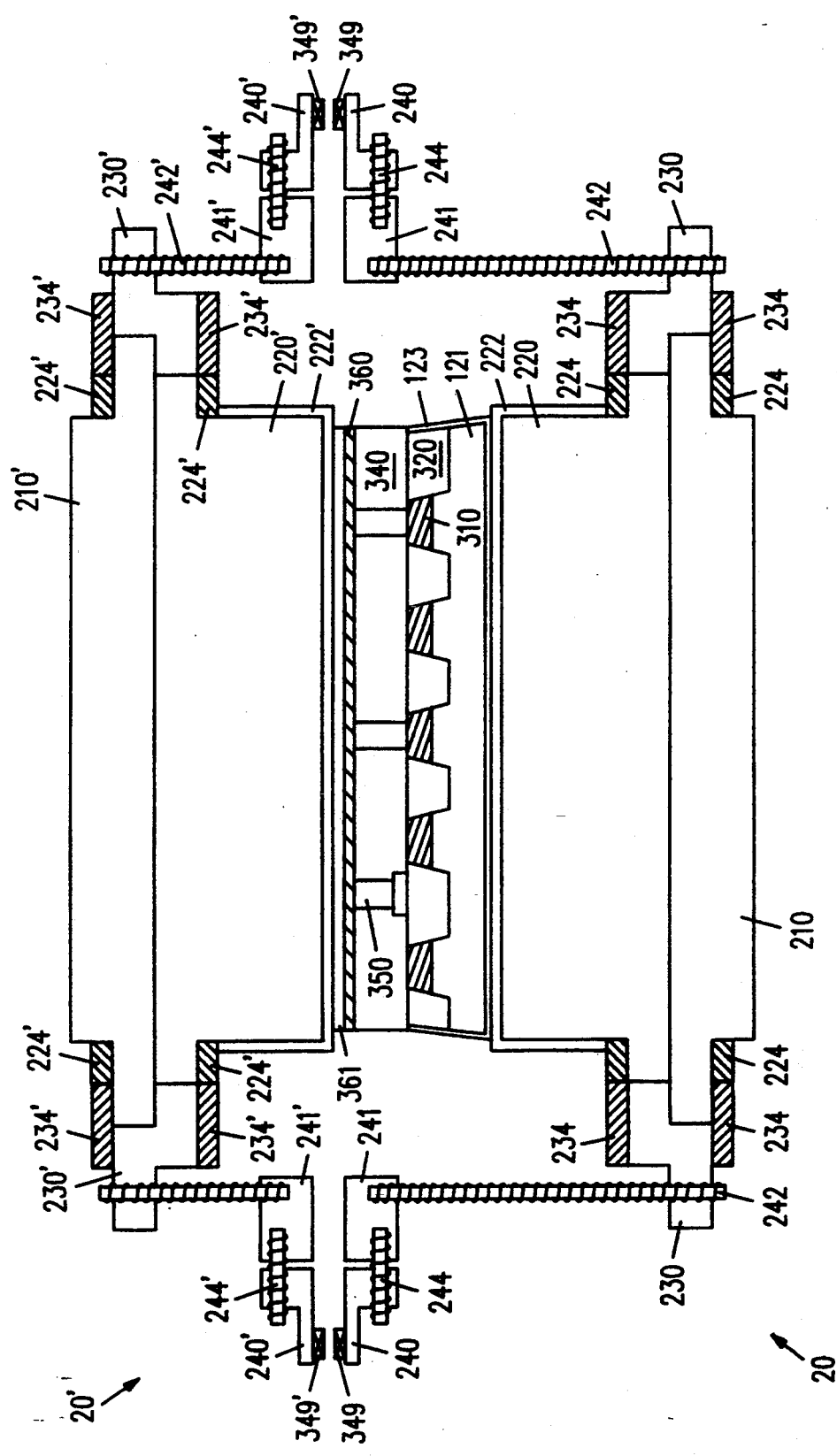
Figure 4A:
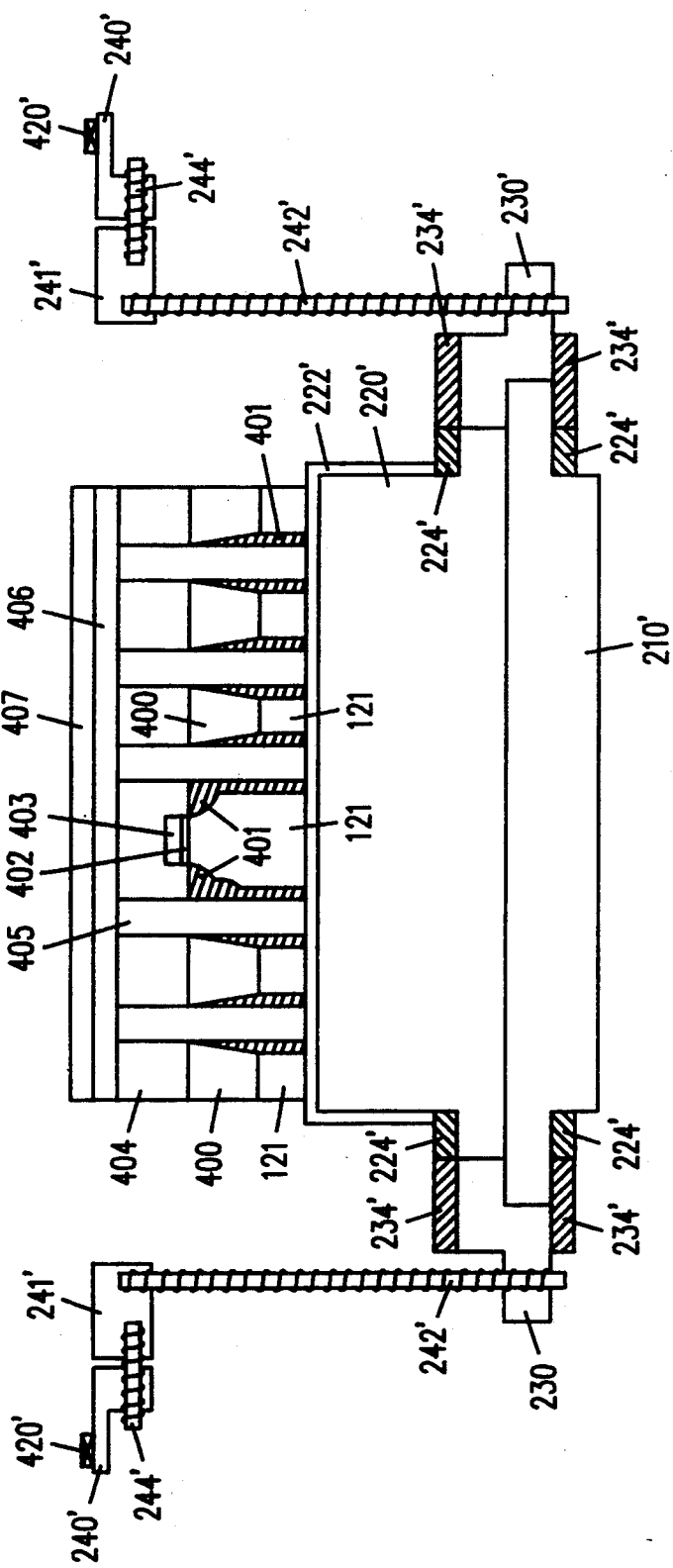
FIG. 4 demonstrates the parallel process technique in IC manufacturing.
Figure 4B:
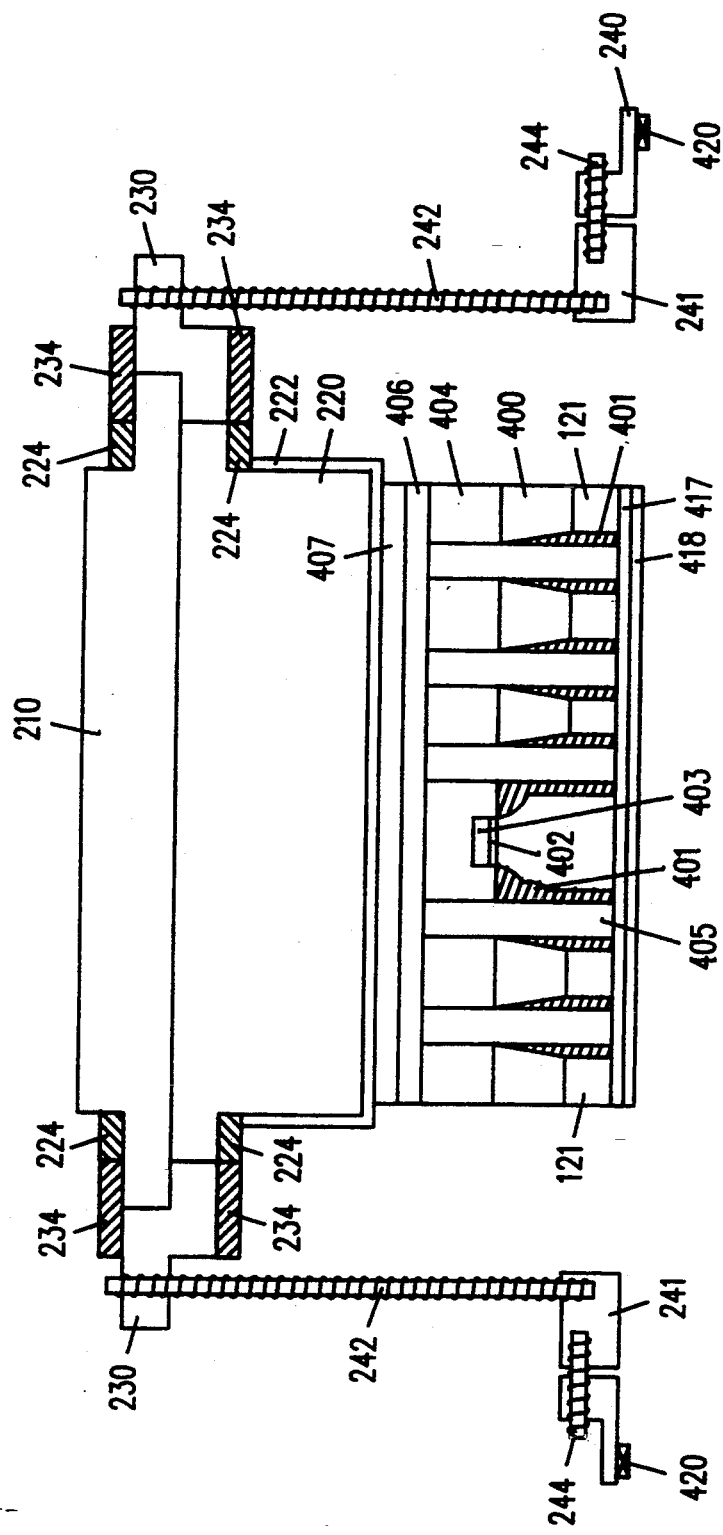
Figure 4C:
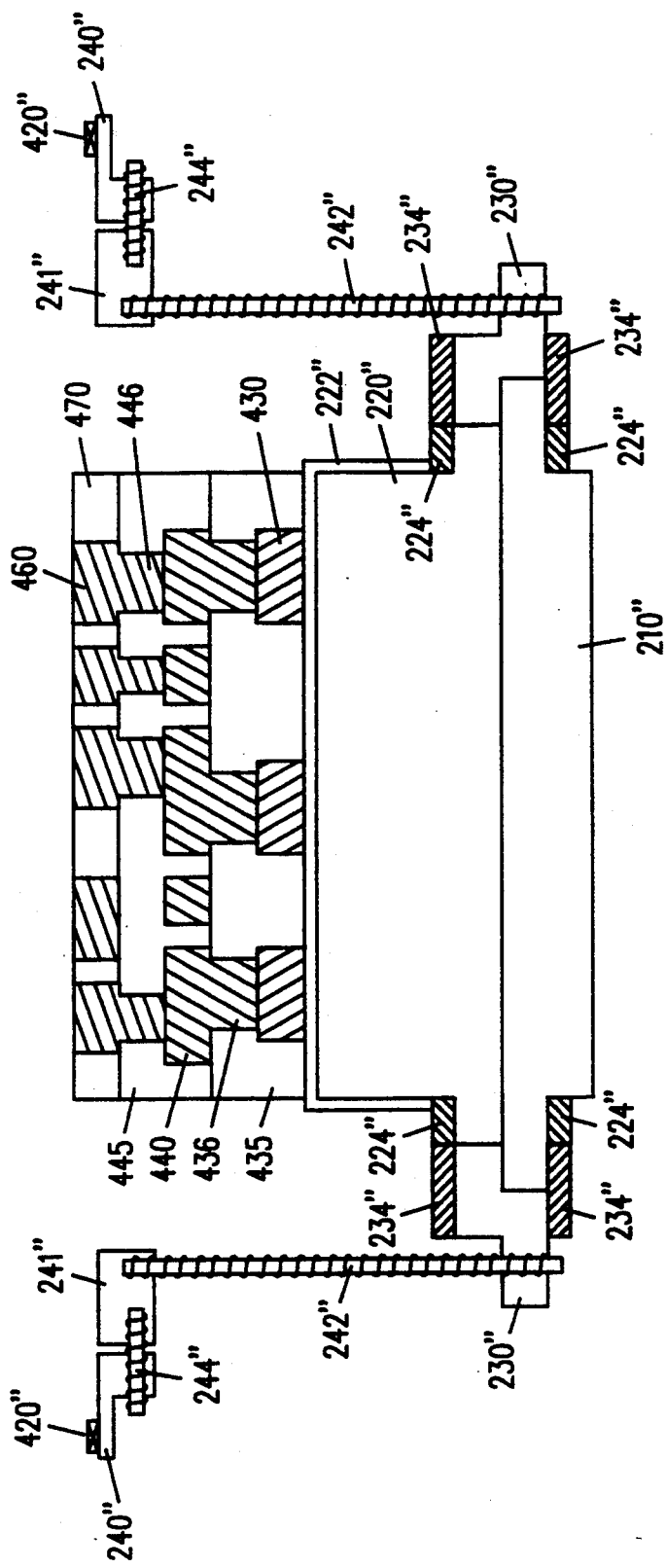
Figure 4D:
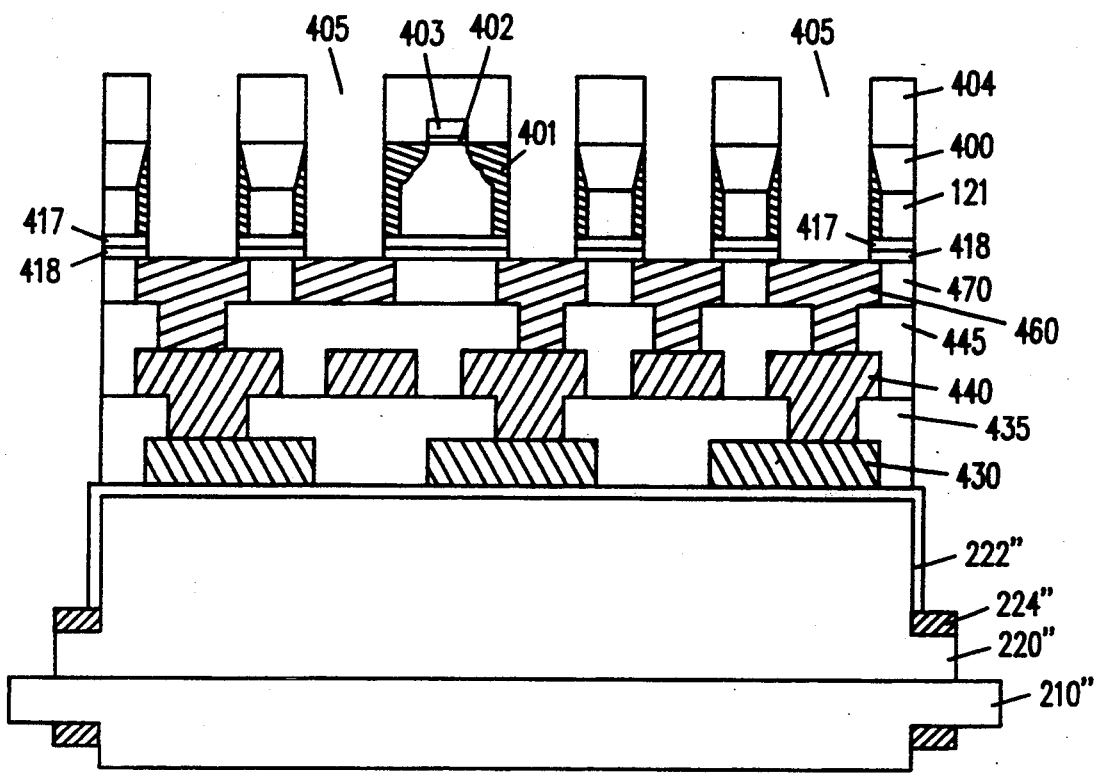
Figure 4E:
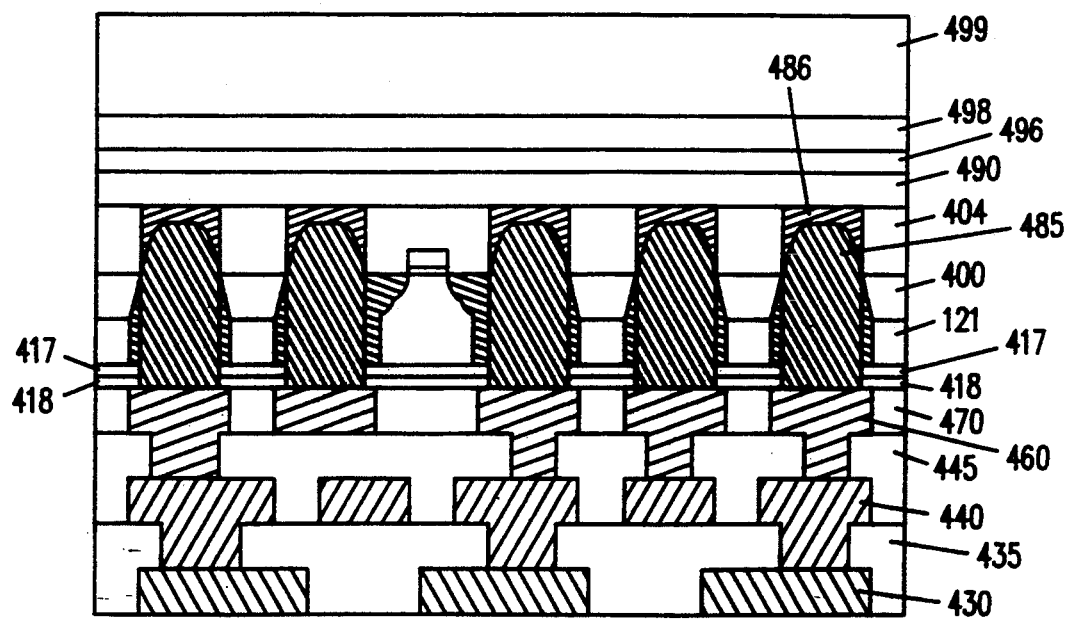

The silicon film 121 can be further thinned down by forming field oxide patterns 127 and 129 to the desired depth on bonded wafer 12 before the bonding operation to bond the bonded wafer 12 to bonding assistant plate 220 as shown in FIG. 2d. Thus, after slicing bonded wafer 12 along line DD', since field oxide patterns have material of silicon dioxide which has much slower polishing rate in the polish operation, it serves as the polishing stop during lapping and polishing operation, therefore very thin uniform silicon film 121 can be obtained. Bonding-assistant plate 220 described above is a solid poly crystal silicon plate. An alternative form is shown in FIG. 2e. The alignment set remains the same as shown in FIG. 2a, but is not shown. Stainless steel is used for both bonding-assistant plate 260 and support plate 250. Now, bonding-assistant plate 260 has opening 262, which is mostly occupied by extension 251 of support plate 250. After bonding-assistant plate 260 is clamped to support plate 250 by clamp-1 224. Spin-on glass 264 (hereafter denoted as SOG) is spun and etched back as shown in FIG. 2e. Poly silicon layer 265 is deposited to the desired thickness which is determined by the opening 262 spacing 261. For example, 10 um poly silicon layer 265 is deposited for 4 mils spacing 261. Polishing is performed after poly silicon layer 265 deposition, followed by SiO$_2$ layer 267 formation for the bonding operation described in FIG. 2b. After SOI wafer bonding operation, support plate 250 is removed, followed by oxide etch and poly etch to release SOI wafer (not shown). Another alternative of FIG. 2e is shown in FIG. 2f. Bonding-assistant plate and support plate are combined as one bonding operation plate 280 which has opening 284 with spacing 282. The opening 284 is filled up with a material which has different etch characteristics from those of bonding operation plate 280. When bonding operation plate 280 is made from stainless steel, quartz or teflon, then for example the opening 284 is filled with poly layer 290 which is polished, followed by SiO$_2$ layer 292 formation as shown. After completion of SOI bonding, poly silicon layer 290 is etched to release SOI wafer (not shown).

The advantage of the use of bonding tool set 20 can be seen in FIG. 3 for the application in alleviating the high dense metal line definition. Although only metal line definition is used as an example, other IC patterns such as diffusion or bipolar structures can be equally well applied. The difficulty of the high dense metal line definition is alleviated by making metal lines on both sides of the silicon film 121. Referring to FIG. 3a, silicon film 121 is obtained as described in FIG. 2b. The diffusion patterns 310 are defined by field oxide isolation 320. Poly pattern 330 is defined followed by BPSG layer 340 deposition, densification and planarization. Contact holes 350 are formed on the poly and diffusion regions as shown with silicide filled up the contact holes 350. The example of silicide can be titanium silicide (Ti Si$_2$) or tungsten silicide (WSi$_2$) which is formed by the conventional method. Poly layer 360 is deposited, polished and SiO$_2$ layer 361 is formed. The alignment pattern 349 is moved to the desired position. The other bonding tool set 20' with other alignment pattern 349' at the desired position is bonded to poly layer 360 as shown in FIG. 3b. Alignment pattern 349' is moved down to the level at interface between silicon film 121 and bonding-assistant plate 220 with the help of alignment pattern 349. The bonding tool set 20 is removed and SiO$_2$ layer 370 is formed followed by other contact holes 390 etch with the help of other alignment pattern 349', as shown in FIG. 3c. The other alignment set of other bonding tool set 20' is removed, followed by doped silicide 391 formation in other contact hole 390, which results in the diffusion region 393 as shown in FIG. 3d. Metal line pattern 395 is defined, followed by passivation layer 397 deposition. Adhesive layer 398 is formed and substrate 399 is bonded to passivation layer 397. The example of the material of adhesive layer 398 can be epoxy resin. Since no more high temperature is needed for further process steps, substrate 399 can be made from a material which is suitable for IC manufacturing such as quartz, semiconductor like silicon and gallium arsenide, ceramics and plastics. The other bonding tool set 20' is removed (not shown), followed by the removal of SiO$_2$ layer 361 and poly layer 360. Metal line pattern (not shown) is defined on BPSG layer 340 and the conventional process steps are carried out to complete the IC fabrication. Obviously, die bonding pads can be formed on both sides of silicon film 121 if desired by employing this method to achieve three-dimensional chip bonding technique. Furthermore if desired, two different types of silicon films can be bonded by the use of the bonding tool set 20. As shown in FIG. 3e for example, silicon film 121 is p-type silicon material and the desired IC patterns (not shown) are fabricated, followed by bonding N-type silicon film 126. Then the procedure of FIG. 3a to 3d can be followed to make the desired patterns on both sides of the stack of n- and p-type films 126 and 121.

The further advantage of the use of bonding tool set 20 is shown in FIG. 4. A new process flow is introduced to manufacture IC. This new process flow is called parallel process technique which simultaneously makes the desired number of IC pattern layers on a separate bonding tool set, followed by bonding them together according to the desired sequence to complete the IC manufacturing. The desired number of IC pattern layers can be a single layer or more than one layer. An example demonstrated in FIG. 4 is given for one poly layer, 2-metal layers process flow to make one transistor to explain the principle of the invention. The process steps from initial start to the contact operation are carried out on one bonding tool set and from contact operation to bonding pad definition on another bonding tool set. FIG. 4a shows the transistor fabrication with the use of the other bonding tool set 20'. Silicon film 121 is obtained with the method described in FIG. 2. Field oxide isolation regions 400 are defined, gate oxide 402 is grown, followed by poly gate 403 definition. Diffusion regions 401 are formed, followed by BPSG layer 404 formation operation and planarization. Contact holes 405 are opened by etching BPSG layer and silicon film 121. Doped silicide is formed in contact holes 405 to extend diffusion region 401 as shown. Poly layer 406 is deposited and slightly polished to smooth surface, followed by oxide layer 407 formation. The other alignment pattern 420' is positioned at the desired location. Now, the bonding tool set 20 is bonded to the poly layer 407 with the help of other alignment pattern 420' to position alignment pattern 420 of bonding tool set 20. The alignment pattern 420 is moved down to the level at interface between silicon film 121 and other bonding-assistant plate 220'. Other bonding tool set 20' is removed, silicon nitride layer 417 is formed, followed by the adhesive layer 418 formation as shown in FIG. 4b. At the same time, bonding pad pattern 430 is defined on another bonding assistant plate 220" of another bonding tool set 20" as shown in FIG. 4c. Passivation layer 435 is formed and planarized, followed by pad via 436 opening. Metal-2 layer pattern 440 is defined. Pad via 436 can be easily filled by any conventional method such as high temperature metal sputtering method. The interdielectric layer 445 is formed and planarized, followed by via 446 opening. Metal-1 layer pattern 460 is defined, followed by another passivation layer 470 formation and polishing operation is carried out to smooth surface and to expose metal-1 pattern. Another alignment pattern 420" is positioned at the desired location. Now metal-1 pattern 460 is bonded to nitride layer 417 by glueing two structures of FIG. 4b and 40 with the use of both alignment patterns 420 and another alignment pattern 420". Bonding tool set 20 and another alignment set of another bonding tool set 20" are removed. Oxide and poly etch are carried out to remove oxide layer 407 and poly layer 406, followed by silicide etch of contact holes 405. Silicon nitride layer 417 in contact holes 405 is etched, followed by the removal of adhesive layer 418 in contact holes 405. The finished structure is shown in FIG. 4d. Now metal is sputtered to the desired thickness, followed by the removal of the sputtered metal except in the contact hole region to form metal plug 485 in contact holes 405 as shown in FIG. 4e. The removal of the sputtered metal can be carried out either by polishing or by etching with the different material such as tungsten on the metal plug 485 in contact holes 405. After the formation of metal plug 485, tungsten is deposited and etched back to form tungsten plug 486 on metal plug 485 in contact holes 405. Another oxide layer 490 is formed, followed by passivation layer 496 deposition. Adhesive layer 498 is applied to bond the desired substrate 499, followed by the removal of another bonding-assistant plate 220" to complete the IC fabrication. This parallel process technique shortens the IC fabrication time, since only bonding operation and couple of layers deposition and etch with no masking operation are carried out after the completion of the contact operation. Also, bonding pads can be defined on top of metal-2 layer, the die size is reduced. Bonding pads can be easily defined on both sides of silicon film 121 to achieve three-dimensional chip bonding for alleviating the difficulty of the high-pin-count pad layout. Many derivatives of this technique can be obtained, in particular when silicon film 121 is very thin (in the micrometer range). The one with common skill of IC fabrication technique can easily apply this parallel process technology to fabricate IC product with the individually desired process flow.

What is claimed is:

1. A technique to produce a first wafer having a structure which consists of a single crystal semiconductor film on an insulator, comprising the steps of:
   a) assembling a first bonding tool set;
   b) first bonding second wafer which provides said single crystal semiconductor film onto said bonding tool set;
   c) slicing said second wafer to result in a third wafer on said bonding tool set;
   d) lapping and polishing said third wafer to obtain said single crystal semiconductor film;
   e) bonding said first wafer onto said single crystal semiconductor film;
   f) removing said first bonding tool set.

2. A technique in claim 1 in which said bonding tool set is made from materials which are suitable for the conventional integrated circuits manufacturing environments.

3. A technique in claim 1 in which said insulator is a dielectric material commonly used in IC manufacturing.

4. A technique in claim 1 in which said wafer is made from materials used in IC manufacturing quartz, single crystal silicon, poly crystal silicon, compound semiconductor, ceramic and plastic.

5. A technique in claim 1 in which said semiconductor film has a thickness which is determined by the depth of the field oxide patterns that are fabricated on said second wafer before the operation at said steps of b.

6. A technique in claim 1 in which said second wafer is sandwiched by said first bonding tool set and second bonding tool set which is bonded onto said second wafer before the operation at said steps of c.

7. A technique in claim 1 in which before operation at said steps of e, said first wafer is bonded onto third bonding tool set which is removed at said steps of f.

8. A technique in claim 1 in which said bonding tool set consists of bonding-assistant plate that is fastened to a support plate.

9. A technique in claim 8 in which said support plate has a continuous circular ring shape.

10. A technique in claim 8 in which said support plate has a segmental circular ring shape.

11. A technique in claim 8 in which said bonding-assistant plate is removed by a method such as chemical etch technique and/or mechanical lapping technique.

12. A technique in claim 8 in which said bonding-assistant plate has a thickness which provides multiple slicing operations in such a manner that said bonding-assistant plate has sufficient thickness left for repeated uses in next bonding operations after each said slicing operation.

13. A technique in claim 8 in which said bonding-assistant plate has holes in such a manner that each of said holes is mostly occupied by an extension of said support plate to result in a slot which is partially filled by other material having different etch characteristics from said bonding-assistant plate, followed by forming a layer of another material which has another different etch characteristics from both said bonding-assistant plate and said other material to a thickness enough to planarize the surface which is polished to further smooth said surface.

14. A technique in claim 8 in which said bonding-assistant plate and said support plate are combined to become one bonding operation plate which has openings that are filled with a material which has different etch characteristics from said one bonding operation plate and has a thickness enough to planarize the surface that is polished to further smooth said surface.

15. A technique in claim 14 in which said material has a layered structure which consists of first material having different etch characteristics from said bonding operation plate and second material having another different etch characteristics from both said first material and said one bonding operation plate.

16. A technique in claim 8 in which said bonding-assistant plate and said support plate are combined to become a first single solid plate to produce a SOI wafer, comprising the steps of:
   a) bonding fourth wafer onto said single solid plate,
   b) slicing said fourth wafer to result in fifth wafer on said single solid plate,
   c) lapping and polishing said fifth wafer to result in said SOI wafer.

17. A technique in claim 16 in which said fourth wafer is sandwiched by said first single solid plate and second single solid plate which is bonded onto said fourth wafer before the operation at said step of b.

18. A technique in claim 8 in which said bonding tool set further includes an alignment set which consists of an alignment annular ring that has alignment patterns for an alignment operation and is attached to alignment ring movement support which is attached to alignment ring support that is fastened to said support plate.

19. A technique in claim 18 in which said alignment annular ring has a continuous ring shape.

20. A technique in claim 18 in which said alignment annular ring has a segmental circular ring shape.

21. A technique in claim 18 in which said an alignment operation is to position and align said alignment patterns for a bonding operation.

22. A technique to manufacture an integrated circuit patterns on both sides of a single crystal semiconductor film on insulator, comprising the steps of:
   a) fabricating first IC patterns on first side of said semiconductor film on first bonding tool set,
   b) positioning first alignment patterns on said first bonding tool set,
   c) bonding second bonding tool set onto said semiconductor film,
   d) positioning second alignment patterns of said second bonding tool set,
   e) moving said second alignment patterns in an alignment operation with the help of said first alignment patterns,
   f) removing said first bonding tool set,
   g) fabricating second IC patterns on second side of said semiconductor film on said second bonding tool set,
   h) bonding a substrate onto said semiconductor film,
   i) removing said second bonding tool set,
   j) continuing the process to complete the IC fabrication on said first side of said semiconductor film.

23. A technique in claim 22 in which said bonding second bonding tool set at step c is carried out after second semiconductor film is bonded onto said semiconductor film which has been processed with said first IC patterns.

24. A technique in claim 23 in which said second semiconductor film has a n or p type of doping of the same type of doping of said semiconductor film and p or n type of doping from said semiconductor film, and further said bonding operation is repeatedly processed to construct multiple structures of said semiconductor film on insulator.

25. A technique in claim 22 in which said integrated circuit patterns includes die bonding pads which are fabricated on said both sides to result in three-dimensional chip packaging.

26. A technique in claim 22 in which said substrate is made from a material which is suitable for IC manufacturing.

27. A technique to manufacture integrated circuits with a parallel process technology, comprising the steps of:
   a) simultaneously fabricating each patterned layer on a thin film on a separate individual bonding tool set, followed by positioning each alignment pattern of said individual bonding tool set;
   b) bonding second processed thin film on second bonding tool set onto first processed thin film on first bonding tool set by the use of said first alignment pattern of said first bonding tool set and said second alignment pattern of said second bonding tool set,
   c) removing said second bonding tool set;
   d) positioning said first alignment pattern;
   e) bonding third processed thin film on third bonding tool set onto said second processed thin film by the use of said first alignment pattern of said first bonding tool set and third alignment pattern of said third bonding tool set;
   f) removing said third bonding tool set;
   g) repeating above bonding operation to bond an additional said each patterned layer according to a fabrication sequence to complete manufacturing.

28. A technique in claim 27 in which said thin film is a semiconductor film, an insulator film a silicon dioxide layer, a silicon nitride layer, a combination of silicon dioxide and silicon nitride layer, a conductive film metal layer.

29. A technique in claim 27 in which said separate individual bonding tool set is used to fabricate more than one patterned layer.

* * * * *